United States Patent
Schmidt et al.

(10) Patent No.: US 7,218,659 B2
(45) Date of Patent: May 15, 2007

(54) HIGH POWER SEMICONDUCTOR LASER DIODE

(75) Inventors: Berthold Schmidt, Erlenbach/Zurich (CH); Susanne Pawlik, Zurich (CH); Achim Thies, Zurich (CH); Christoph Harder, Zurich (CH)

(73) Assignee: Bookham Technology plc, Northamptonshire (GB)

( * ) Notice: Subject to any disclaimer, the term of this patent is extended or adjusted under 35 U.S.C. 154(b) by 483 days.

(21) Appl. No.: 10/890,714

(22) Filed: Jul. 14, 2004

(65) Prior Publication Data

US 2005/0030998 A1    Feb. 10, 2005

Related U.S. Application Data

(63) Continuation-in-part of application No. 09/852,994, filed on May 10, 2001, now Pat. No. 6,782,024.

(51) Int. Cl.
    *H01S 5/00*    (2006.01)
(52) U.S. Cl. .................. 372/45.01; 372/39; 372/43.01; 372/44.01; 372/46.01; 372/46.011; 372/87
(58) Field of Classification Search .............. 372/39, 372/43.01, 44.01, 45.01, 46.01, 87; 382/46.011
    See application file for complete search history.

(56) References Cited

U.S. PATENT DOCUMENTS

| | | | | |
|---|---|---|---|---|
| 4,964,135 A | * | 10/1990 | Mitsui et al. | 372/46.01 |
| 5,280,535 A | * | 1/1994 | Gfeller et al. | 372/45.01 |
| 5,757,833 A | * | 5/1998 | Arakawa et al. | 372/45.01 |

(Continued)

FOREIGN PATENT DOCUMENTS

EP    0 373 933    12/1989

OTHER PUBLICATIONS

Horie et al., Thermal Rollover Characteristics up to 150° C. of Buried-Stripe Type 980-nm Laser Diodes with a Current Injection Window Delineated by a $Sin_x$ Layer, vol. 12, No. 1, Jan. 2000, pp. 13-15.

(Continued)

*Primary Examiner*—B. William Baumeister
*Assistant Examiner*—Hrayr A. Sayadian
(74) *Attorney, Agent, or Firm*—Renner, Otto, Boisselle & Sklar, LLP

(57) ABSTRACT

Semiconductor laser diodes, particularly high power AlGaAs-based ridge-waveguide laser diodes, are often used in opto-electronics as so-called pump laser diodes for fiber amplifiers in optical communication lines. To provide the desired high power output and stability of such a laser diode and avoid degradation during use, the present invention concerns an improved design of such a device, the improvement in particular significantly minimizing or avoiding (front) end section degradation of such a laser diode and significantly increasing long-term stability compared to prior art designs. This is achieved by establishing one or two "unpumped end sections" of the laser diode. One preferred way of providing such an unpumped end section at one of the laser facets (10, 12) is to insert an isolation layer (11, 13) of predetermined position, size, and shape between the laser diode's semiconductor material and the usually existing metallization (6). A further embodiment shows separate, further isolation layers (5) extending along the laser diode, potentially abutting the ridge waveguide of the laser.

26 Claims, 5 Drawing Sheets

U.S. PATENT DOCUMENTS

| | | | |
|---|---|---|---|
| 5,844,931 A * | 12/1998 | Sagawa et al. | 372/45.01 |
| 5,953,358 A * | 9/1999 | Ishikawa et al. | 372/50.1 |
| 6,200,837 B1 * | 3/2001 | Ihn et al. | 438/166 |
| 6,373,875 B1 * | 4/2002 | Yu et al. | 372/46.01 |
| 6,810,055 B2 * | 10/2004 | Ohkubo | 372/46.01 |
| 6,928,097 B2 * | 8/2005 | Chida | 372/46.01 |
| 2002/0024985 A1 * | 2/2002 | Takeuchi et al. | 372/46 |
| 2002/0126723 A1 * | 9/2002 | Ohkubo | 372/46 |
| 2003/0128730 A1 * | 7/2003 | Ohkubo | 372/46 |

OTHER PUBLICATIONS

European Search Report regarding Application No. 02405380.3 mailed Oct. 6, 2003.

* cited by examiner

HIGH POWER SEMICONDUCTOR LASER DIODE

This application is a continuation-in-part of application Ser. No. 09/852,994, filed May 10, 2001 now U.S. Pat. No. 6,782,024.

FIELD OF THE INVENTION

The present invention relates to semiconductor laser diodes, particularly to AlGaAs-based laser diodes of high light output power. Such laser diodes are commonly used in opto-electronics, often as so-called pump lasers for fiber amplifiers in the field of optical communication, e.g. for Erbium-doped fiber amplifiers. Specifically ridge-waveguide laser diodes are suited to provide the desired narrow-bandwidth optical radiation with a stable light output power in a given frequency band. Light output power and stability of such laser diodes are of crucial interest and any degradation during normal use must be avoided. The present invention concerns an improved design of such laser diodes, the improvement in particular significantly minimizing or avoiding front facet degradation of such laser diodes at very high light output powers compared to prior art designs.

BACKGROUND AND PRIOR ART

Semiconductor laser diodes of the type mentioned above have, for example, become important components in the technology of optical communication, particularly because such lasers can be used for amplifying optical signals immediately by optical means. This allows to design all-optical fiber communication systems, avoiding any complicated conversion of the signals to be transmitted, which improves speed as well as reliability within such systems.

In one kind of optical fiber communication systems, the laser diodes are used for pumping Erbium-doped fiber amplifiers, so-called EDFAs, which have been described in various patents and publications known to the person skilled in the art. An example of some technical significance are ridge-waveguide laser diodes with a power output of 150 mW or more, whose wavelengths match the Erbium absorption lines and thus achieve a low-noise amplification. Several laser diodes have been found to serve this purpose well and are used today in significant numbers. However, the invention is in no way limited to such laser diodes, but applicable to any ridge-waveguide laser diode.

Generally, laser diode pump sources used in fiber amplifier applications are working in single transverse mode for efficient coupling into single-mode fibers and are mostly multiple longitudinal mode lasers, i.e. Fabry-Perot (or FP) lasers. Three main types are typically being used for Erbium amplifiers, corresponding to the absorption wavelengths of Erbium: InGaAsP at 1480 nm; strained quantum-well InGaAs/AlGaAs laser diodes at 980 nm; and AlGaAs laser diodes at 820 nm.

One of the major problems of semiconductor laser diodes of the types mentioned above is the degradation in the end section area, in particular at the front facet of the laser. This degradation is believed to be caused by uncontrolled temperature increase at the mirror facet regions, especially at high power outputs, which temperature increase in turn is probably caused by unwanted carrier recombination in these regions and heating due to free carrier injection.

Consequently, ways have been sought to prevent this carrier recombination in the laser diode's facet regions. One attempt is described in Itaya et al U.S. Pat. No. 5,343,468. It discloses a compound semiconductor laser diode with a current blocking region formed in one facet portion of the laser structure. Though this design may be advantageous for the kind of laser diodes addressed by Itaya, namely regrown/buried double heterostructure laser diodes, it is not manufacturable for ridge waveguide laser diodes of the kind addressed by the present invention. A further problem occurs when manufacturing AlGaAs laser diodes with a two step epitaxial process. Here, the quick oxidation of Al seriously interferes with the Itaya process and thus makes it rather unsuitable for industrial application.

Yu et al. U.S. Pat. No. 6,373,875 discloses a plurality of current-blocking layers, one each over each of the end sections of the laser's ridge waveguide and two separate blocking layers fully covering the remaining body right and left of the ridge waveguide. This structure thus has several layers which are laterally not contiguous and the interruption just at the edge of the waveguide may lead to undesired effects.

Sagawa et al. U.S. Pat. No. 5,844,931 discloses a "windowed" current-blocking layer covering the ridge and the whole body with a longitudinal opening, i.e. a window, over the center part of the ridge. Apart from the fact that some of the current blocking layers in this USP are actually conductive, not isolation layers (as in the present invention), it discloses one single layer fully covering the laser body, with just a window over part of the ridge. Thus, the blocking layer is longitudinally not limited to the end section(s) of the laser. The manufacturing of such a windowed blocking layer process requires very careful alignment, especially of the window, to obtain the desired results and thus appears rather complex. In contrast to that, providing separate isolation layers, one layer over one or both end sections and separate lateral layers on both sides of the ridge waveguide, as the present invention does, enables a more easily manufacturable design, with the lateral isolation layers preferably being formed by a self-aligned process.

Thus, it is the main object of the invention to devise a simple and reliable design for a high power ridge waveguide laser diode which avoids the abovementioned end section degradation to provide a stable light output power under all operating conditions. Another object is to provide an economical manufacturing method, allowing reliable mass production of such laser diodes.

A further aspect is the provision of separate isolation layers, one layer over one or both end sections and separate lateral layers on both sides of the ridge waveguide. The lateral isolation layers extend longitudinally on the semiconductor body along the ridge waveguide, substantially abutting the latter.

A still further object is to avoid adding to the complexity of the laser diode structure and to keep the number of additional structural components of the laser diode at a minimum.

THE INVENTION

In brief, to solve the issues addressed above, the present invention creates a ridge waveguide laser diode with so-called unpumped end sections, thus effecting a relaxation of the high stress areas in the vicinity of the laser's facets. An appropriate manufacturing process for defining these unpumped end sections to block the induction of high current density—and therefore stresses—into the end sections forms another aspect of the invention.

A ridge waveguide laser diode structured according to the present invention exhibits an extreme improvement over prior art laser diodes, especially with regard to its long-term stability and reliability, as will be shown.

This significant improvement is effected by just a minor increase in manufacturing complexity so that conventional manufacturing equipment may be used and usual manufacturing processes may be applied. Also, the laser diode itself has the same dimensions as before, thus avoiding any packaging changes or problems.

As briefly mentioned above, the design idea of one or two unpumped end section(s) in a ridge waveguide laser diode is to relax high stress areas close to the laser's facets. Due to a crystal inhomogeneity—often produced by cleaving the laser cavity—and high optical power densities within these regions, especially in the front facet/mirror vicinity, the regions adjacent to the mirrors are believed to be the weakest points within the whole waveguide in terms of reliability.

Particularly in the front facet region, an increased failure rate at very high optical output powers can be observed. The same was found, though to a lesser degree, in the vicinity of the back mirror. Since the material degradation in these high stress region is accelerated by a combination of optical power density and electrical current density, it seems advantageous to reduce the latter. This is effected by establishing one or two unpumped end section(s) according to the present invention.

As mentioned above, a further aspect is the provision of separate isolation layers, one layer over one or both end sections and separate lateral layers on both sides of the ridge waveguide. The lateral isolation layer may have the form of a stripe extending longitudinally along the ridge waveguide, substantially abutting the ridge waveguide and may even partly cover its inclined edges. Preferably it is formed by a self-aligned process. These measures enable a rather simple and straightforward manufacturing of the device.

DETAILED DESCRIPTION OF A PREFERRED EMBODIMENT AND A PROCESS

In the following, an embodiment of the invention shall be described by reference to the drawings, in which.

Figure 6:
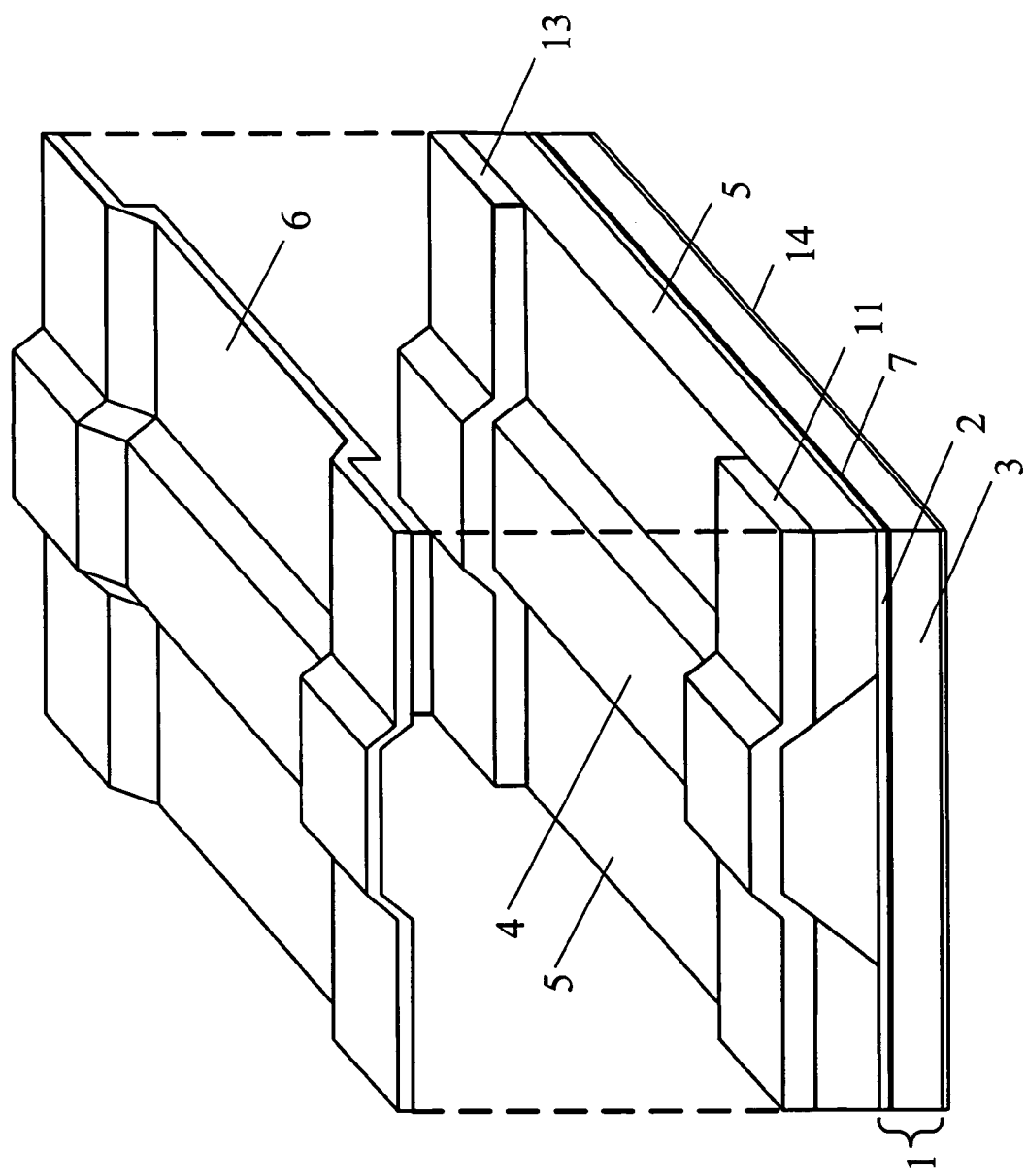

FIG. 6 an embodiment of the invention with a pair of separate lateral isolation layers or stripes, extending longitudinally on both sides of the ridge waveguide.

Generally speaking, the invention aims at reducing the local current density within the laser's end sections to reduce the degradation caused and accelerated by local heating of the laser.

The local current in the end section is—as is the current in other parts of the laser diode—essentially generated by the injection current driving the laser diode. Thus, to reduce the local current density and to finally prevent current flow within the laser diode's end sections, the current injected into these end sections must be reduced. Various processes have been tested, including contact lift-off, removing the contact by etching, or otherwise interrupting the contact around these regions. However, most of the processes tested and realized failed due to material, processing, or reliability problems.

The most successful approach was an "isolation layer" process to achieve the desired unpumped end sections. This approach differs from earlier ones in the way that an additional thin isolation layer is placed between the semiconductor contact layer and the metal contact at the laser diode end sections. The semiconductor contact layer may even be removed.

The advantages are fourfold: the isolation layer
provides an effective isolation of the contact layer within this region;
exhibits no negative influence on the cleaving quality;
does not influence the electro-optical properties of the device; and.
provides a good thermal contact due to the overlaying metal layer.

It was found that it is advantageous to retain the full area metallization as metal contact to provide sufficient cooling, which is particularly important at high power outputs.

It was also found that there are limits to the size, especially the longitudinal extension of the isolation layer:
The minimum longitudinal extension should be greater than the medium diffusion length of the free carriers in the laser diode's semiconductor material. Thus, the minimum length depends on the material characteristics of the semiconductor used.
The maximum length of the isolation layer, on the other hand, is limited by an increase in optical absorption loss commonly reducing the laser diode efficiency.
In the worst case, the P/I characteristic may show beginning inhomogeneities just above laser threshold.

The lateral extension of the isolation layer is given by the structure of the laser diode's ridge and is preferably wider than the latter.

So much for the general considerations.

Figure 1:
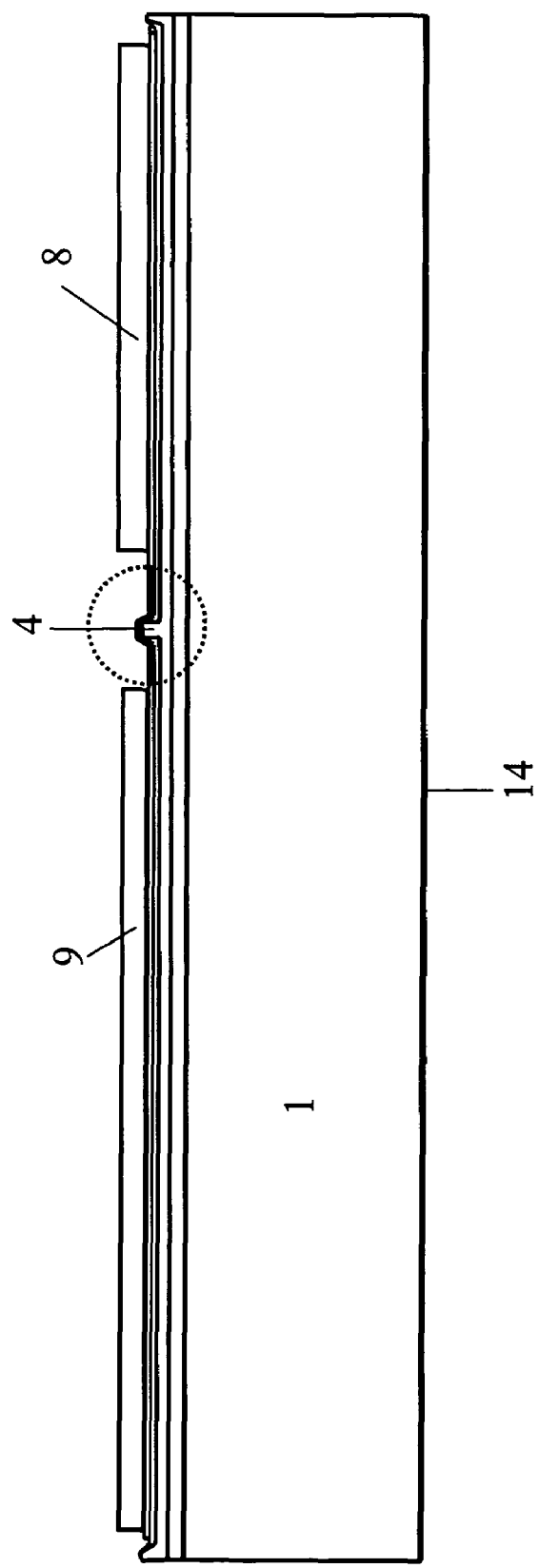
FIG. 1 shows in a front view the general structure of a ridge waveguide laser diode.
Figure 2:
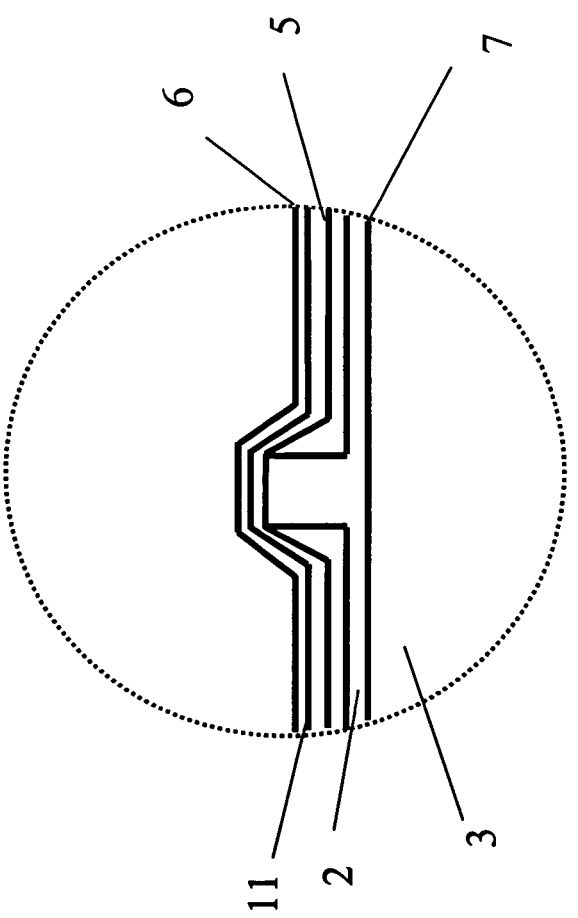
FIG. 2 depicts the laser diode's front facet in an enlarged view.

FIGS. 1 and 2 show the basic layout of an embodiment of the invention, namely an AlGaAs ridge waveguide laser diode in a front view. A semiconductor body or substrate 1, here a GaAs substrate, forms the basis for the laser diode.

In principle, the 980 nm pump laser diode consists of a SQW (strained quantum well) active region 7 sandwiched by two AlGaAs cladding layers 2 and 3. The top p-metallization 6 covers the semiconductor ridge waveguide 4 together with the embedding material 5.

At the bottom of the substrate 1 is an n-metallization 14. FIG. 2 further shows the additional isolation layer 11, here made of SiN, between the top metallization 6 and the AlGaAs active region layer 2, extending over the ridge 4.

Figure 4:
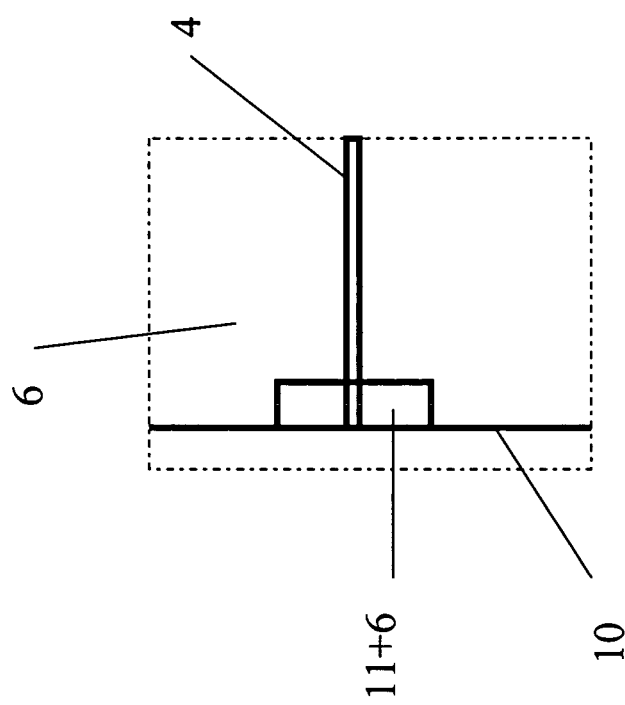
FIG. 4 shows the laser diode's front section enlarged, again in a top view.
Figure 3:
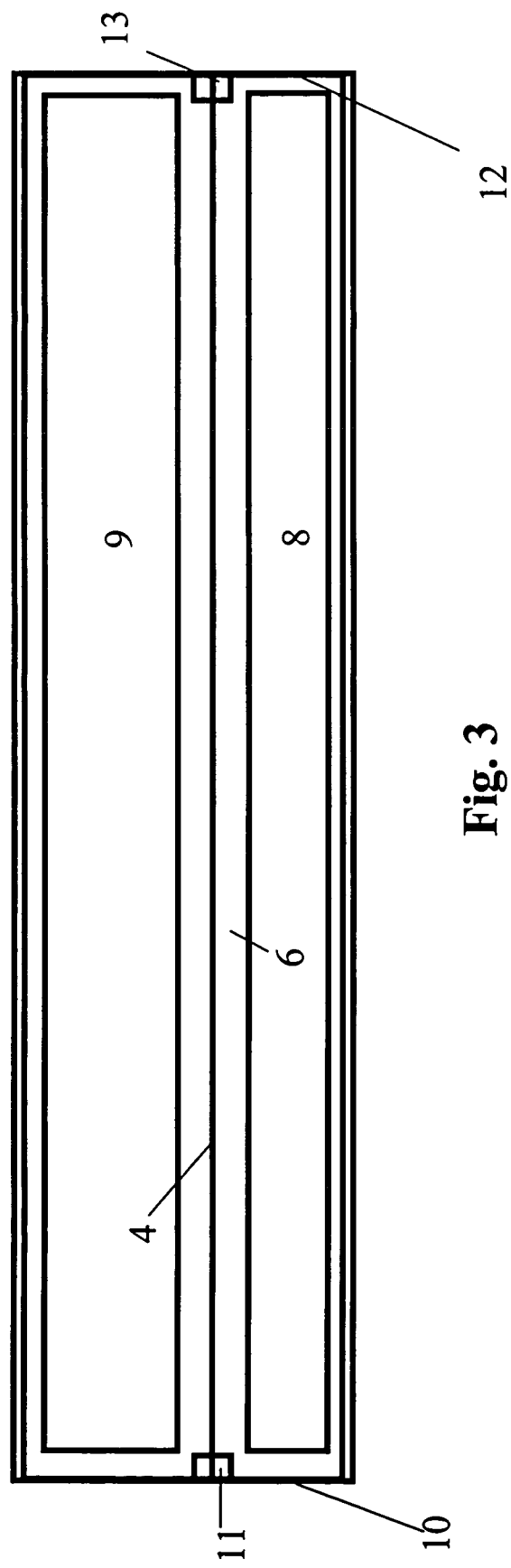
FIG. 3 illustrates, in a top view, the laser diode with its two facets and the unpumped end sections.

The additional isolation layer 11, as shown in FIGS. 3 and 4 and described below, extends longitudinally over only a fraction of the total length of the laser ridge 4. Two ridge protecting layers 8 and 9 cover the remaining surface of the laser diode, protecting it against the environment.

FIGS. 3 and 4 depict a top view of an AlGaAs laser diode according to the invention. The two ridge protecting layers 8 and 9 extend over the whole length of the laser diode, having the ridge 4 between them, the latter being shown as a single line in FIG. 3. Please note that the physical dimensions of such a AlGaAs ridge waveguide laser diode are quite small, about 0.4*1.8 mm with a thickness of about 0.15 mm.

FIG. 4 shows the front facet section of the laser diode enlarged. A front mirror 10 covers the front facet of the laser diode, the p-metallization 6 extending over the ridge 4 and the surrounding area of the laser diode. An additional isolation layer 11 is positioned at the end of the ridge 4 under the metallization 6, insulating a small part of this metallization 6 from the laser diode's active region and thus defining the unpumped end section at the laser diode's front end.

As shown in FIG. 3, a back mirror 12 covers the back facet of the laser diode. A second additional isolation layer 13, essentially identical to the layer 11 at the laser diode's front end, may be located there. This layer 13 results in the same blocking effect as at the laser diode's front end. However, this second insulation is not necessary; a large part of the advantages of the invention may already be achieved by a single isolation layer 11 at the laser diode's front end. Also, the reverse arrangement, i.e. an isolation layer only at the laser diode's back end and none at the front end may work advantageously under certain conditions and environments.

The length of the isolation layer 11—and, if applicable, of the second isolation layer 13 at the laser diode's back end—along the waveguide ridge 4 is determined by two limits. It should be at least as long as, preferably longer, than the mean free diffusion length of the free carriers in the active region of the laser diode. On the other hand, a drop in the power/current curve of the laser diode must be avoided which fact limits the maximum length of the isolation layer 11 and/or of the isolation layer 13 at the laser diode's back end.

Figure 5:
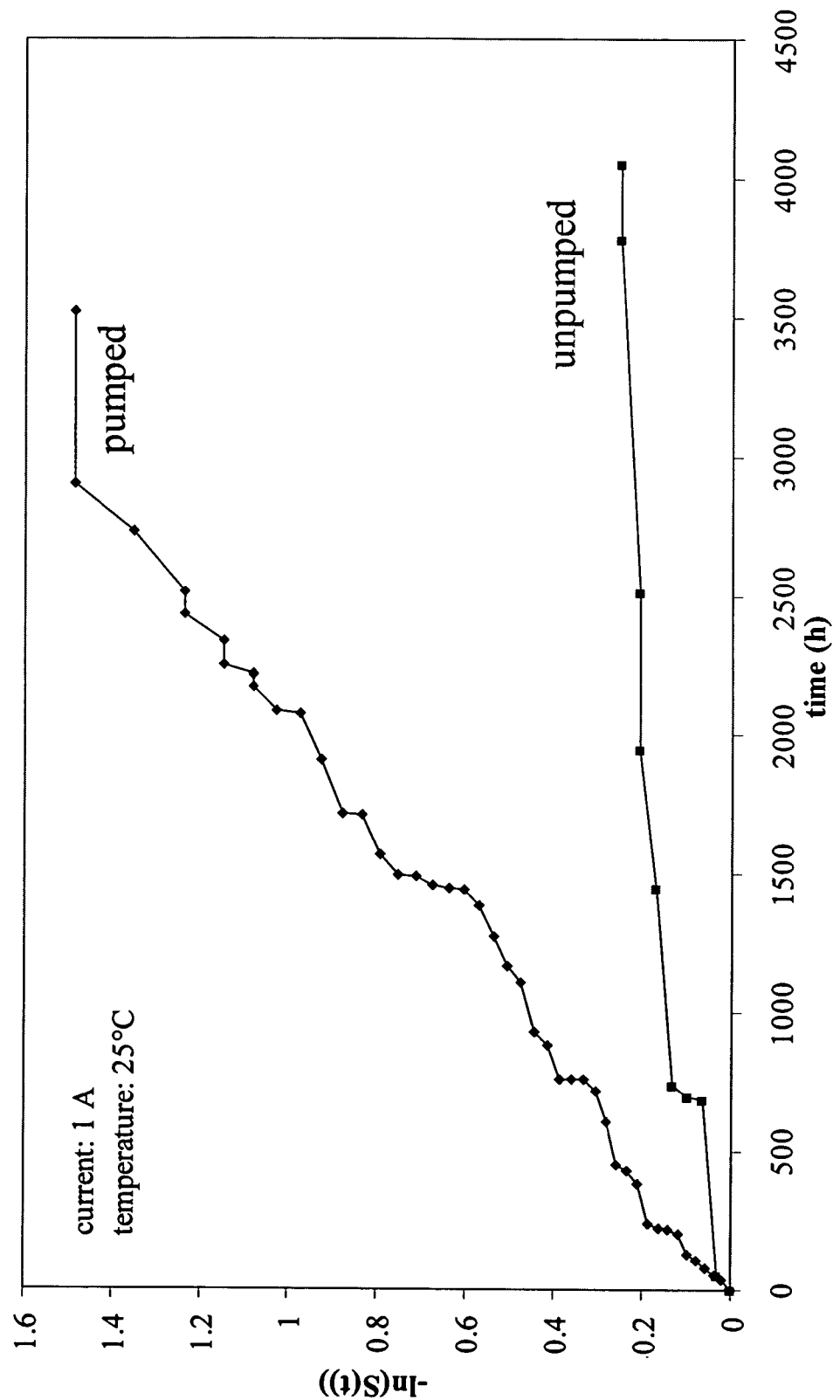
FIG. 5 is a graph illustrating an example of the tremendous lifetime increase comparing a pumped laser diode vs. an unpumped laser diode according to the invention.

FIG. 5 is a graph comparing life time measurements made of a standard ridge waveguide laser diode with a laser diode having unpumped end sections according to the invention. Shown is the function $-\ln(S(t))$, where $S(t)$ is the survival function or survival fraction commonly describing the fraction of the population expected to survive until time t, $(S(t)=n(t)/n(0))$. The difference between the two curves is striking. The standard "pumped" laser diode shows an 10 times higher failure rate compared to the "unpumped" laser diode at high power condition, here 1A injection current and 25° C. temperature. At that temperature and injection current, single mode laser diodes emit around 800 mW light output power.

FIG. 6 finally depicts another embodiment of the invention, somewhat similar to the earlier shown embodiment, in which the embedding material 5 of FIG. 2 is laterally separated into two layers or stripes 5.

One may say that the embodiment of FIG. 6 exhibits two separate "sets" of isolation layers. One set consists of the layer(s) over one or both end sections as described above, the other, separate set, consists of lateral layers or stripes on both sides of the ridge. These lateral isolation layers extend longitudinally along the ridge and abut the latter. They may even cover the edges of the ridge, particularly when these edges are inclined. But they may also be arranged some distance from and essentially parallel to the ridge waveguide. Anyway, a self-aligned process is the preferred manufacturing method for these lateral isolation layers.

In the design depicted in FIG. 6, the isolation layers 11 and 13 over the unpumped end sections extend laterally over the whole width of the semiconductor body 1. The further, lateral isolation layers 5 are shown on both sides of the ridge waveguide 4, abutting the latter and partly covering its edges. The cladding layers 2 and 3 and the active region 7 are also shown in FIG. 6. The isolation layers 11 and 13 may differ in thickness and material from the further lateral isolation layers 5. The latter may be also used to define a refractive index step of the laser cavity. Extending the rather thin isolation layers 11 and 13, which are about 30 nm thick, over the whole width of the semiconductor body 1 simplifies the alignment process for the isolation layer structuring and improves the facet cleaving quality during the subsequent bar separation process. As usual, a metallization layer 6 is located on top of the laser device, here shown in some distance in a kind of exploded view.

In the following, a way of manufacturing a laser diode with unpumped end sections according to the invention is described.

Essentially, this process is realized by introducing one or more patterned isolation layers as shown in FIGS. 3 and 4 between the laser semiconductor and the p-metallization. The preferred way is to form appropriate patterns by in-situ controlled dry chemical reactive ion etch back of a PECV (plasma enhanced chemical vapor) deposited SiN layer. Alternatively, a sputtering process may also be used.

Usually, several hundred laser diodes of the kind described here are fabricated on a semiconductor waver.

After embedding the ridge waveguide, except for the contact layer, with isolating material (here SiN), an about 50 nm thin SiN isolating layer is PECV deposited on the whole wafer. Other materials like $SiO_2$, $Al_2O_3$, or TiN and thicknesses may also be used. The patterning is defined in a photolitographical step in a way that 20 μm×40 μm rectangles of remaining resist are realized above the region forming the (unpumped) end section(s) later on. The resist is used as a mask for the following dry chemical etch process. Later, the resist is stripped by using organic solvents and water, as usual. The manufacturing process then continues with the standard p-metallization processing and the subsequent steps known to a person skilled in the art.

Returning to FIG. 6, the manufacturing process of the device shown there is essentially the same as described above. In the latter, the unpumped end section is established by careful alignment of the additional isolation layers 11 and 13, respectively, on top and around the ridge waveguide. The manufacturing process for the device shown in FIG. 6 includes some additional features to improve the manufacturing process and the device reliability. As shown, the isolation layers 11 and 13 extend laterally over the whole width of the semiconductor body 1. They are formed in a separate process, where an applied isolation layer is structured using a lithographic mask process and a dry etching step, after definition of the further, lateral isolation layers 5 as self-aligned layers around the ridge waveguide on top of the semiconductor body 1. Thus any of the isolation layers 11 and 13 may be of different thickness and/or material as compared to the further isolation layers 5. The latter may also be used to define a refractive index step of the laser cavity. As mentioned above, extending any of the about 30 nm thick isolation layers 11 and 13 over the whole semiconductor body width simplifies the alignment process for the isolation layer structuring. It also improves the facet cleaving quality during the bar separation process.

Additional advantages and modifications will readily occur to persons skilled in the art and the invention is therefore not limited to the specific embodiments, details, and steps shown and described hereinbefore.

The invention claimed is:

1. A semiconductor ridge waveguide laser diode including
   a semiconductor body,
   an active region including a ridge waveguide with two end sections,
   front and back facets closing said end sections, each with a mirror,
   a metallization over at least part of said semiconductor body and said ridge for injecting carriers into said active region, and means for limiting said injection of carriers at least at one of said end sections, thus providing at least one unpumped end section, said injection limiting means comprising an isolation layer which
  laterally extends contiguously over said ridge waveguide and at least part of said semiconductor body and
  longitudinally covers only said one of said end sections.

2. The laser diode according to claim 1, wherein two separate injection limiting means are provided, one each at the front and the back end section of the laser diode.

3. The laser diode according to claim 1, wherein the isolation layer is located directly under the metallization.

4. The laser diode according to claim 1, wherein the isolation layer between the laser diode's active region and the metallization is made from $SiO_2$, $Al_2O_3$, TiN or SiN.

5. The laser diode according to claim 1, wherein the isolation layer extends under only a fraction of the area of the metallization.

6. The laser diode according to claim 1, wherein the isolation layer is about 50 nm thick.

7. The laser diode according to claim 1, wherein the isolation layer covers an area of approximately 20 μm×40 μm.

8. The laser diode according to claim 1, wherein the isolation layer's longitudinal extension is as long as the mean diffusion lengths of the free carriers within the laser's active region.

9. The laser diode according to claim 1, wherein the isolation layer's longitudinal extension is longer than the mean diffusion length of the free carriers within the laser's active region.

10. The laser diode according to claim 1, wherein the isolation layer's lateral extension is smaller than the metallization's lateral extension.

11. The laser diode according to claim 1, wherein the isolation layer's lateral extension is as wide or wider than the metallization's lateral extension.

12. The laser diode according to claim 1, further comprising
  one or more further isolation layers extending longitudinally along the semiconductor body, preferably substantially abutting the ridge waveguide.

13. The laser diode according to claim 12, wherein the further isolation layer is at least partly located between the semiconductor body and the isolation layer of the injection limiting means.

14. The laser diode according to claim 12, wherein the further isolation layer extends longitudinally and/or laterally over only a part of the semiconductor body.

15. The laser diode according to claim 12, wherein two further isolation layers are provided extending longitudinally up to the edges of the ridge waveguide.

16. The laser diode according to claim 1, wherein the laser diode substrate is GaAs, the active region is AlGaAs/InGaAs, and the isolation layer is SiN.

17. The laser diode according to claim 1, wherein at least one of the two end sections of the ridge waveguide is unconstricted.

18. The laser diode according to claim 17, wherein the two end sections are dimensionally different.

19. The laser diode according to claim 17, wherein a single isolation layer is provided, placed over the front end section of the ridge waveguide.

20. The laser diode according to claim 17, wherein two isolation layers are provided, one each over the front end section and the back end section of the ridge waveguide.

21. The laser diode according to claim 20, wherein at least one of the isolation layers is shorter and/or narrower than the metallization.

22. The laser diode according to claim 20, wherein the two isolation layers are of the same shape and/or size.

23. The laser diode according to claim 17, further comprising
  one or more further isolation layers extending along the semiconductor body, preferably substantially abutting the ridge waveguide.

24. The laser diode according to claim 23, wherein the further isolation layer is at least partly located between the semiconductor body and the isolation layer of the injection limiting means.

25. The laser diode according to claim 23, wherein the further isolation layer extends longitudinally and/or laterally over only a part of the semiconductor body.

26. The laser diode according to claim 23, wherein two further isolation layers are provided extending longitudinally up to the edges of the ridge waveguide.

* * * * *